United States Patent [19]

Killion et al.

[11] Patent Number: 5,144,675
[45] Date of Patent: Sep. 1, 1992

[54] VARIABLE RECOVERY TIME CIRCUIT FOR USE WITH WIDE DYNAMIC RANGE AUTOMATIC GAIN CONTROL FOR HEARING AID

[75] Inventors: Mead C. Killion, Elk Grove Village, Ill.; Harry Teder, Minneapolis, Minn.; Arthur C. Johnson, Lakeville, Minn.; Steven P. Hanke, Bloomington, Minn.

[73] Assignee: Etymotic Research, Inc., Elk Grove Village, Ill.

[21] Appl. No.: 502,433

[22] Filed: Mar. 30, 1990

[51] Int. Cl.$^5$ .............. H04R 25/00; H04R 29/00; H03G 3/00; H03F 3/45

[52] U.S. Cl. .............. 381/68.4; 330/254; 330/284; 381/56; 381/68; 381/68.2; 381/104

[58] Field of Search .............. 307/490, 492; 330/250, 330/252, 254, 278, 282, 284; 381/68, 68.2, 68.4, 104, 106, 150, 168; 379/390

[56] References Cited

U.S. PATENT DOCUMENTS

| | | | |
|---|---|---|---|
| 3,229,049 | 1/1966 | Goldberg | 381/68.2 |
| 3,714,462 | 1/1973 | Blackmer | 307/492 |
| 3,789,143 | 1/1974 | Blackmer | 381/106 |
| 4,088,963 | 5/1978 | Machida et al. | 330/284 |
| 4,170,720 | 10/1979 | Killion | 381/168 |
| 4,461,025 | 7/1984 | Franklin | 381/56 |
| 4,718,099 | 1/1988 | Hotvet | 381/68.4 |
| 4,759,071 | 7/1988 | Heide | 381/68.4 |
| 4,823,392 | 4/1989 | Walker | 381/106 |
| 4,882,761 | 11/1989 | Waldhauer | 381/106 |
| 4,891,837 | 1/1990 | Walker et al. | 379/390 |
| 4,928,074 | 5/1990 | Sato et al. | 330/254 |

FOREIGN PATENT DOCUMENTS

| | | | |
|---|---|---|---|
| 0231721 | 8/1987 | European Pat. Off. | 381/68.4 |
| 2135684 | 1/1973 | Fed. Rep. of Germany | 381/68.4 |

OTHER PUBLICATIONS

Schilling and Belove, "Electronic Circuits Discrete and Integrated", 1979, Section 8.10–Automatic Gain Control.

Omni Hearing Systems, "Hearing Instrument Specifications", Dec. 1990, Model X312A.

Primary Examiner—James L. Dwyer
Assistant Examiner—William Cumming
Attorney, Agent, or Firm—McAndrews, Held & Malloy, Ltd.

[57] ABSTRACT

A gain control voltage is applied to a control terminal of a variable gain hearing aid amplifier which is logarithmically related to a signal voltage level which is sensed at either an input terminal or an output terminal of the amplifier and which is below a certain threshold value, and an impedance is connected to the control terminal which includes, in parallel a first capacitor, a series combination of a resistor and a second capacitor of larger value than the first, the impedance being operative at signal levels below the threshold value to provide a rapid recovery from short intense sounds and a much slower recovery from prolonged intense sounds.

4 Claims, 1 Drawing Sheet

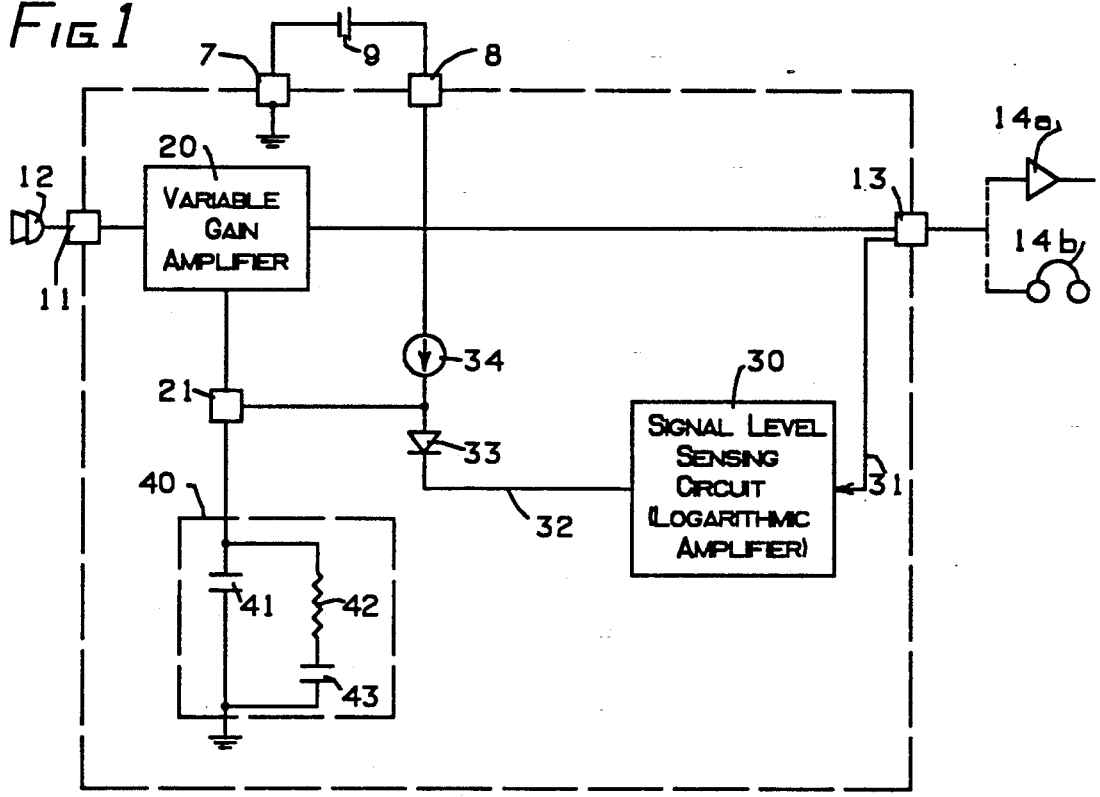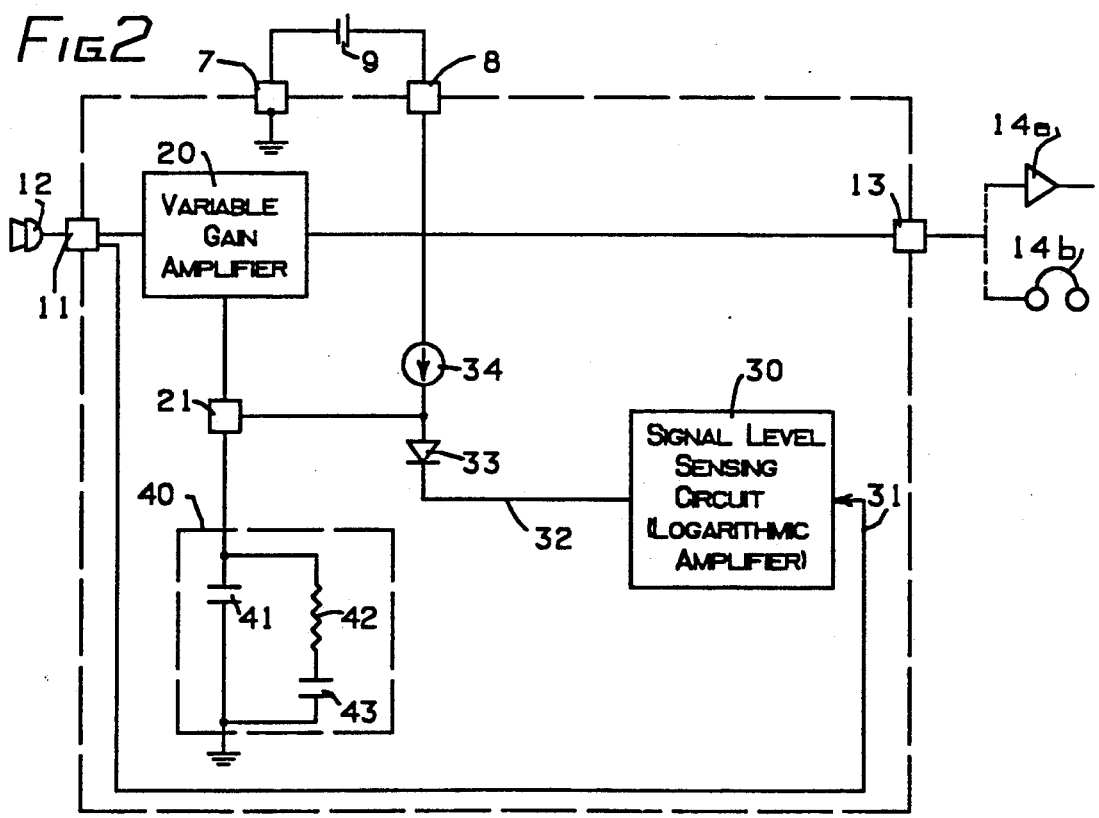

VARIABLE RECOVERY TIME CIRCUIT FOR USE WITH WIDE DYNAMIC RANGE AUTOMATIC GAIN CONTROL FOR HEARING AID

REFERENCE TO RELATED APPLICATIONS

Reference is made to an application of Mead C. Killion, Norman P. Matzen, Clyde M. Brown, Jr., William A. Cole, James B. Compton, Steven J. Iseberg, Johathan K. Stewart and Donald L. Wilson, Ser. No. 07/431,531, filed Nov. 3, 1989 and entitled: "HIGH FIDELITY HEARING AID AMPLIFIER". That application will be referred to herein as the "-531 application." The disclosures of said application are incorporated by reference. In addition, reference is made to an application of Mead C. Killion, and Donald W. Wilson, Ser. No. 07/431,540, filed Nov. 3, 1989 and entitled: "VARIABLE ATTENUATOR CIRCUIT" and to an application of Mead C. Killion, Ser. No. 07/414,903, filed Sep. 29, 1989 and entitled: "LOW BATTERY DETECTOR AND INDICATOR" now abandoned and to an application of Mead C. Killion, Ser. No. 07/416,703, filed Oct. 3, 1989 and entitled: "HEARING AID WITH AUDIBLE ALARM." These four applications as a group will be referred to herein as "the four disclosures."

FIELD OF THE INVENTION

This invention relates to hearing aids and is more particularly directed to the operation of wide dynamic range automatic gain control circuits which operate to increase the gain of the hearing aid for quiet sounds.

BACKGROUND OF THE INVENTION

Compression limiting circuits are widely used to prevent overmodulation in AM and FM transmitters, to prevent overload distortion in audio amplifiers, and to prevent overload distortion in hearing aids and/or to prevent loudness discomfort for the wearer of the hearing aid. In operation, such circuits automatically reduce the overall system gain once the input signal level exceeds a certain threshold value. Such circuits are typically designed with a compression ratio of 5:1 or greater (each 5 dB increase in input above the threshold value results in only 1 dB or less increase in output) and with a rapid reduction in gain with a sudden increase in input level and a relatively slower recovery to full gain after the input level has dropped below the threshold value. The response time of such circuits is commonly characterized by two numbers; the "attack time" defined as the time required for system gain to stabilize to within 1 or 2 dB of its asymptotic value after a sudden increase in input level, and the "recovery time" defined as the time required for the system gain to recover to within 1 or 2 dB of full gain after the input signal level has dropped below the threshold value.

A common problem with such circuits is that no one choice of recovery time constant appears adequate for all situations: A long recovery time will produce audible gaps or "holes" in the program material if that program material contains short intense transients; a recovery time short enough to prevent such holes will cause audible "breathing" and a "noisy" sound such as is commonly heard in live baseball broadcasts.

A solution to these problems has been to use a variable-recovery-time circuit such as described in a paper of G. A. Singer, in *Audio Engineering*, November 1950, pp. 18–19 and 69–70 entitled "New Limiting Amplifier."

The application of variable-recovery-time circuits to compression-limiting circuits in hearing aids was disclosed by David Hotvet in U.S. Pat. No. 4,718,099, issued Jan. 5, 1988 and assigned to Telex Communications, Inc. The Hotvet circuit has been successfully used under the commercial name of "adaptive compression" by Telex Communications, substantially improving the operation of their compression-limiting hearing aid circuits. The improvement can be heard on the recorded demonstration cassette tape available from Telex corporation under the title "Telex Adaptive Compression Fitter Demonstration, #HA-110" originally issued in 1988.

In contrast to output-limiting type circuits, which act to prevent the output signal levels from exceeding a certain value, the principal applicant (Killion) has developed a wide-dynamic-range logarithmic-compression (WDRLC) circuit which does *nothing* to limit signal levels above its threshold of operation, but instead acts to increase system gain for weaker (below-threshold) signals. This WDRLC circuit was disclosed in Killion U.S. Pat. No. 4,170,720, issued Oct. 9, 1979, hereafter called the -720 patent. In further contrast to output-limiting compression circuits, the operation of the WDRLC circuit permits the necessary change in gain with signal level to be spread out over a 50 to 60 dB range of input levels, with corresponding smaller compression ratios; a value of 2:1 is common, with compression ratios of 1.2:1 up to a maximum of 3:1 sometimes used.

The contrast between limiting-type and WDRLC-type circuits is easily seen in hearing aid applications, where the limiting-type circuit acts to limit the maximum hearing aid output for loud sounds and does nothing to affect the gain for quiet sounds, whereas the WDRLC circuit acts to increase the gain of the hearing aid for quiet sounds and provides limitless "transparent" operation for loud sounds (which receive neither amplification nor attenuation but are allowed to pass through unchanged).

By way of reference, the performance of the -720 patent circuit is similar to that of the compression circuits used in the compressors manufactured for the recording industry by the dbx corporation (Massachusets) under U.S. Pat. Nos. 3,789,143 issued Jan. 29, 1974 and 3,714,462 issued Jan. 30, 1973, both to David Blackmer. Although the performance is similar, the Blackmer circuits typically require ±12 Volts or more for proper operation, rendering them inoperable for hearing applications where operation on a 1.1 to 1.5 Volt cell is normally required.

The principal applicant and some of his colleagues have recently applied for four U.S. patents on circuit developments that permitted applicant's original -720 patent circuit, plus further improvements, to be realized in a silicon integrated-circuit version. These form the "four disclosures" referenced earlier.

Because the typical operation of WDRLC circuits in hearing aids for too-loud sounds, and because the WDRLC circuits typically spread the change in gain over a wide range of input signal levels (typically 50 to 60 dB), the principal applicant did not originally believe that adaptive compression would provide significant benefit to WDRLC hearing aid applications. Indeed, the Blackmer circuits used in commercial dbx compressors did not incorporate such variable-recovery-time circuits, nor was any such circuit taught in the Blackmer patents or in the Goldberg patent (U.S. Pat. No. 3,229,049 filed Aug. 4, 1960), the latter being the classic WDRLC hearing aid patent.

In extensive laboratory listening tests undertaken during development of the integrated circuit hearing aid amplifier described in the aforementioned four disclosures, a single recovery time was chosen as adequate for all listening conditions, which included pre-recorded traffic noise, cafeteria noise, cocktail party noise, and office noise, as well as quiet speech, and classical, jazz, and popular music. The teachings of the patent literature for WDRLC hearing aid circuits appeared confirmed: Variable-recovery-time circuits were needed only for output-limiting applications where high compression ratios are employed.

During several months of wearing the first production hearing aids incorporating the WDRLC integrated circuit described in the aforementioned four disclosures, however, the principal applicant noticed several occasions on which a "breathing" or "pumping" action of the compression circuit was audible. Other early wearers reported similar observations; one commented on the "busy" operation of the automatic gain control circuit. One situation in which the "pumping" became quite obvious was in a scientific lecture situation, where the hiss of the slide projector fan would "disappear" each time the lecturer spoke and then audible "reappear" quickly during each pause in his speaking.

In extensive further laboratory listening tests in cooperation with co-applicants Tedar, Hanke and Johnson at Telex Communications, only under the most carefully contrived listening situations was it possible to hear any improvement when the adaptive compression circuit of FIG. a was substituted for the single-recovery-time circuit of the -531 application. Nonetheless, applicant had his hearing aids wired so that the adaptive compression circuit of FIG. 1 could be selected by switch. The somewhat surprising result was that in actual "live" real-world listening situations, switching to adaptive compression made a marked improvement in the subjective quality of the compressor operation; an improvement that had been almost impossible to demonstrate in the laboratory situation. Moreover, switching to adaptive compression improved the ability of the hearing aid to accomodate short, intense transient sounds without distortion and without noticeably changing the gain of the hearing aid for the ongoing sounds of interest, much as disclosed by Hotvet for the application of adaptive compression to compression-limiting circuits.

As a result of the real-world listening tests, applicant's company Etymotic Research has negotiated a license with Telex corporation, owners of the Hotvet patent, under which Etymotic Research will incorporate the adaptive compression circuit into the WDRLC circuitry of its hearing aid amplifiers. The use of the adaptive compression circuit with WDRLC circuits appears to be novel, however, not having been anticipated in the Hotvet patent, and applicants respectfully request that a patent be granted on this improvement.

SUMMARY OF THE INVENTION

The present invention has as its principal object the provision of an improved wide-dynamic-range-logarithmic-compression (WDRLC) circuit for hearing aid applications.

It is a more specific object to provide a WDRLC circuit with a variable recovery time that reduces the audibility of the "breathing" that accompanies the gain-changing action of the compressor circuit.

It is a further object to provide a WDRLC circuit that can quickly accomodate short, intense transient sounds without distortion and without noticeably changing the gain for the ongoing sounds of interest.

It is a still further object to provide a WDRLC circuit whose recovery time is variable, being rapid for recovery from short intense transients and being much slower for recovery from prolonged intense sounds.

These and other objects are provided through the addition of the Hotvet adaptive compression circuit to the time-constant determining impedance element in WDRLC circuits.

More specifically, these objects are accomplished in the present invention by the addition of the Hotvet adaptive compression circuit to the time-constant determining impedance in the circuit of the -720 patent and the four disclosures.

BRIEF DESCRIPTION OF THE DRAWINGS

FIG. 1 is the block diagram of a WDRLC circuit, with the attack and recovery time constants of the gain control circuit determined by the impedance means of the present invention.

FIG. 2 is a block diagram of a modified WDRLC circuit similar to that of FIG. 1, but with the input of a sensing circuit connected to a signal input terminal rather than to a signal output terminal.

DESCRIPTION OF THE PREFERRED EMBODIMENT

Turning now to the drawings, FIG. 1 illustrates the operation of the preferred embodiment of the complete inventive WDRLC amplifier system in a hearing aid application. A wide-dynamic-range-logarithmic amplifier circuit 5 contains a circuit ground terminal 7, a supply voltage input terminal 8 arranged to accept power as from a battery 9 connected between terminals 7 and 8, a signal input terminal 11 arranged for receiving an audio input signal such as from a microphone 12, a signal output terminal 13 arranged for delivering an amplified replica of the audio input signal to another amplifier means 14a or reproduction means such as earphone 14b, a variable gain amplifier 20 connected between input terminal 11 and output terminal 13 and having a gain control terminal 21, a signal-level-sensing circuit means 30 having a sense input terminal 31 connected to signal output terminal 13 and a sense output terminal 32, said signal-level-sensing circuit means providing a voltage at terminal 32 that is logarithmically related to the signal voltage whenever the signal voltage falls below a predetermined threshold value (a circuit having such a logarithmic characteristic is described in the -720 patent and identified as #34 in FIG. 3 of that patent), a rectifier diode 33 connected between sense output terminal 32 and gain control terminal 21, a charging current source 34 connected between supply voltage terminal 8 and gain control terminal 21, and an impedance means 40 also connected to gain control terminal 21 for controlling the dynamic gain-control characteristics of compressor circuit 5.

By comparison to the disclosures of the -720 patent and -531 application, which show a single capacitor for impedance means 40, FIG. 1 shows a combination of two capacitors, capacitor 41 (corresponding to the single capacitor 88 in FIGS. 1 and 3 of the -531 disclosure or to capacitor C5 in the -720 patent) and, in addition, a series combination of resistor 42 and capacitor 43 connected in parallel with capacitor 41. It is the addition of resistor 42 and capacitor 43 which provide the variable-release-time operation of the inventive circuit.

In operation, the attack time of the compressor circuit in the circuit configuration of FIG. 1 is determined by the rate at which the voltage on impedance means 40 can be reduced, which is in turn determined primarily by the R-C time constant between the resistance of diode 33 and the capacitance of capacitor 41. Since the resistance of diode 33 can be quite low, attack times of a few mS are easily obtained whether or not resistor 42 and capacitor 43 are added in parallel with capacitor 41.

The variable-recovery-time operation of the circuit of FIG. 1 is easiest to understand in terms of the preferred values for the critical components, which are:

capacitor 41=0.022 uF
capacitor 43=0.22 uF
resistor 42=1.5 Megohm
current source 34=10 nA.

The desirable variable recover time is a result of the difference in relative voltages left on capacitors 41 and 43 after a short, intense transient sound compared to the relative voltages left after a prolonged intense sound. In the case of a short, intense transient, the low impedance of diode 33 rapidly reduces the voltage on capacitor 41, but because of the series resistance of resistor 42 the voltage on capacitor 43 is relatively unchanged. Assume for the sake of illustration that the voltage on capacitor 41 is left 300 mV below the voltage on capacitor 43 after the transient has passed, which will result in a relatively large initial current of 200 nA to flow thru resistor 42 so as to cause capacitor 41 to recharge. But this is 20 times the normal 10 nA recharge current from current source 24, whence it is readily seen that the initial gain recovery after a short, intense transient will be much more rapid than if capacitor 41 were acting alone as shown in the -531 application.

After a prolonged intense sound, on the other hand, capacitor 43 will have discharged thru resistor 42 to essentially the same voltage as capacitor 41. Under these conditions, the only source of recharge current will that of current source 34, which must divide its current between capacitor 41 and 43. With the preferred values shown, once the voltage on capacitor 41 has recharged to approximately 13 mV above the voltage on capacitor 43, the current division will be approximately 9% to capacitor 41 and 91% to capacitor 43, whereupon the time for further recovery will be approximately 11 times longer than if capacitor 41 were acting alone as shown in the -531 application or the original -720 patent. Since a change in control voltage of only 13 mV corresponds to a relatively small gain change in a typical gain controlled amplifier, the majority of the gain recovery will occur at the slower rate, whence it is readily seen that the recovery time of the compression circuit from a prolonged intense sound can exceed the recovery time for a short intense transient by a factor of 100 or more.

FIG. 2 shows an alternate version of the WDRLC amplifier system, sense input terminal 31 of signal level sensing circuit 20 is connected to signal input terminal 11 instead of connected to signal output terminal 13 as shown in FIG. 1. In the alternate version of FIG. 2, a "feed forward" type of compressor action is obtained which may be valuable in certain applications.

It will be understood that modifications and variations may be effected without departing from the spirit and scope of the novel improvements of this invention.

We claim:

1. A hearing aid amplifier including an input terminal arranged for receiving an audio input signal such as from a microphone,
   an output terminal arranged for delivering an amplified replica of said input signal to further amplifier or reproduction means such as an earphone,
   a power source,
   a variable gain amplifier circuit arranged for energization from said power source and connected between said input and output terminals,
   a control terminal arranged for receiving a control signal and controlling the gain of said variable gain amplifier circuit,
   a signal level sensing circuit arranged for sensing a signal voltage level at said output terminal and providing a control voltage signal to said control terminal that is logarithmically related to said signal voltage level at said output terminal whenever said signal voltage level at said output terminal falls below a predetermined threshold value and for thereby providing a wide-dynamic-range logarithmic-compression operation such that gain is increased for weaker signal levels below said predetermined threshold value while signal levels above said predetermined threshold value are amplified transparently without being limited,
   an impedance means connected to said control terminal to determine the dynamic characteristics of said variable gain amplifier circuit at signal levels below said predetermined threshold level at which gain is increased for weaker signal levels through said wide-dynamic-range logarithmic-compression operation of said variable gain amplifier circuit, said impedance means including a first capacitor connected in parallel with a series combination of a resistor and a second capacitor, wherein the value of said second capacitor is greater than that of said first capacitor, and said impedance means being operative to determine the dynamic characteristics of said variable gain amplifier circuit at signal levels below said predetermined threshold level while being operative to provide a recovery time which is variable being rapid for recovery from short intense sounds and being much slower for recovery from prolonged intense sounds.

2. A hearing aid as defined in claim 1, wherein said signal level sensing circuit means is connected between said output terminal and a sense output terminal,
   a diode is connected between said sense output terminal and said control terminal, and
   a current source is connected to said control terminal.

3. A hearing aid amplifier including
   an input terminal arranged for receiving an audio input signal such as from a microphone,
   an output terminal arranged for delivering an amplified replica of said input signal to further amplifier or reproduction means such as an earphone,
   a power source,
   a variable gain amplifier circuit arranged for energization from said power source and connected between said input and output terminals,
   a control terminal arranged for receiving a control signal and controlling the gain of said variable gain amplifier circuit, a signal level sensing circuit arranged for sensing a signal voltage level at said input terminal and providing a control voltage signal to said control terminal that is logarithmically related to said signal voltage level at said input terminal whenever said signal voltage level at said input terminal falls below a predetermined threshold value and for thereby providing a wide-dynamic-range logarithmic-compression operation such that gain is increased for weaker signal levels below said predetermined threshold value while signal levels above said predetermined threshold value are amplified transparently without being limited, an impedance means connected to said control terminal to determine the dynamic characteristics of said variable gain amplifier circuit at signal levels below said predetermined threshold level at which gain is increased for weaker signal levels through said wide-dynamic-range logarithmic-compression operation of said variable gain amplifier circuit, said impedance means including a first capacitor connected in parallel with a series combination of a resistor and a second capacitor, wherein the value of said second capacitor is greater than that of said first capacitor, and said impedance means being operative to determine the dynamic characteristics of said variable gain amplifier circuit at signal levels below said predetermined threshold level while being operative to provide a recovery time which is variable being rapid for recovery from short intense sounds and being much slower for recovery from prolonged intense sounds.

4. A hearing aid as defined in claim 3, wherein said signal level sensing circuit means is connected between said output terminal and a sense output terminal, a diode is connected between said sense output terminal and said control terminal, and a current source is connected to said control terminal.

* * * * *